(12) United States Patent
Hosler et al.

(10) Patent No.: US 10,748,671 B2
(45) Date of Patent: Aug. 18, 2020

(54) RADIAL LITHOGRAPHIC SOURCE HOMOGENIZER

(71) Applicant: GLOBALFOUNDRIES Inc., Grand Cayman (KY)

(72) Inventors: Erik R. Hosler, Cohoes, NY (US); Sheldon J. Meyers, Halfmoon, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 245 days.

(21) Appl. No.: 16/031,767

(22) Filed: Jul. 10, 2018

(65) Prior Publication Data

US 2020/0020458 A1    Jan. 16, 2020

(51) Int. Cl.
| | |
|---|---|
| *G21K 1/04* | (2006.01) |
| *H05G 2/00* | (2006.01) |
| *G03F 7/20* | (2006.01) |
| *G21K 1/06* | (2006.01) |

(52) U.S. Cl.
CPC ........... *G21K 1/04* (2013.01); *G03F 7/70075* (2013.01); *G21K 1/06* (2013.01); *H05G 2/005* (2013.01); *H05G 2/008* (2013.01)

(58) Field of Classification Search
CPC ............ G03F 7/70066; G03F 7/70083; G03F 7/70558
See application file for complete search history.

(56) References Cited

U.S. PATENT DOCUMENTS

| | | | |
|---|---|---|---|
| 7,362,413 | B2 | 4/2008 | Kremer et al. |
| 2006/0126036 | A1* | 6/2006 | Kremer ............... G03F 7/70066 355/30 |
| 2015/0002925 | A1 | 1/2015 | Endres et al. |
| 2017/0363975 | A1* | 12/2017 | Kochersperger .... G03F 7/70066 |
| 2019/0056669 | A1* | 2/2019 | Weidman ............ G03F 7/70083 |

* cited by examiner

*Primary Examiner* — David E Smith
*Assistant Examiner* — Hsien C Tsai
(74) *Attorney, Agent, or Firm* — Amerson Law Firm, PLLC

(57) ABSTRACT

A method includes identifying a contamination region of a collector in a light source, positioning a subset of a plurality of movable light-blocking elements around a periphery of a circular aperture of the light source to compensate for the contamination region, and transmitting light from the light source through the circular aperture.

20 Claims, 5 Drawing Sheets

RADIAL LITHOGRAPHIC SOURCE HOMOGENIZER

BACKGROUND

1. Field of the Invention

The present disclosure generally relates to lithography techniques for the fabrication of semiconductor devices, and, more particularly, to a radial lithographic source homogenizer.

2. DESCRIPTION OF THE RELATED ART

Integrated circuits are formed on the basis of a plurality of sequential process steps to form nanoscale regions of precisely controlled size in one or more material layers of an appropriate substrate. These regions of precisely controlled size are typically obtained by applying lithography, etch, implantation, and deposition techniques at various manufacturing stages in order to pattern a material layer or layers in accordance with the underlying device design. The patterning of material layers formed on the substrate material may be typically accomplished by forming a type of mask layer, which may consist of or may be formed by means of a layer of resist material that is patterned by a lithography process, typically a photolithography process. To this end, the resist may be spin-coated onto the substrate surface and may then be selectively exposed to radiation through a corresponding lithography mask, such as a reticle, in order to image the reticle pattern into the resist layer, thereby forming a latent image therein. After developing the resist material, other mask materials and, finally, the actual device patterns may be formed by further manufacturing processes, such as etching and the like. Since the dimensions of the patterns in sophisticated semiconductor devices are continuously reduced, the finally accomplished resolution of the optical patterning process may, therefore, depend significantly on the imaging capability of the equipment used, the photoresist materials for the specified exposure wavelength, and the target-critical dimensions of the device features to be formed in the device level under consideration.

Extreme ultraviolet lithography (EUV) employs a wavelength shorter than 124 nm, e.g., on the order of 13.5 nm, using a laser-driven tin (Sn) plasma light source. A collector optic focuses collected light from the Sn light source and provides the light to an illuminator. The collector is directly exposed to the plasma. Tin droplets deposit on the collector mirror causing contamination and degrading its performance over time. Collector contamination leads to poor pupil uniformity. One technique for correcting pupil non-uniformities employs a uniformity correction module (UNICOM) that is positioned on the output of the illuminator. The UNICOM module employs a rectangular slit with movable light absorbing elements that are positioned along edges of the slit to set the outer boundary of the slit. The UNICOM module distributes the illumination variation resulting from the collector contamination across the pupil. However, asymmetric contamination of the collector cannot be adequately corrected by the UNICOM module and performance degrades over time, leading to poor pupil uniformity and eventually asymmetry or dead pixels that affect the programmed pupil fill of the illuminator. Restoration of the tool performance requires a maintenance procedure to change the collector, resulting in tool unavailability.

SUMMARY

The present disclosure is directed to various methods and apparatus that may avoid, or at least reduce, the effects of one or more of the problems identified above.

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a radial lithographic source homogenizer. An illustrative method includes, among other things, identifying a contamination region of a collector in a light source, positioning a subset of a plurality of movable light-blocking elements around a periphery of a circular aperture of the light source to compensate for the contamination region, and transmitting light from the light source through the circular aperture.

Another illustrative method includes, among other things, generating a tin plasma in a light source having a circular aperture. A contamination region of tin is identified on a collector in the light source. The collector is to direct light from the light source to the circular aperture. A subset of a plurality of movable light-blocking elements is positioned around a periphery of the circular aperture to compensate for the contamination region. Light from the light source is transmitted through the circular aperture.

An illustrative apparatus disclosed herein includes, among other things, a plasma source to generate light, a collector to direct the light to a circular aperture, a radial homogenizer including a plurality of movable light-blocking elements proximate the circular aperture, and a controller to identify a contamination region of the collector and position a subset of the plurality of movable light-blocking elements around the circular aperture to compensate for the contamination region.

BRIEF DESCRIPTION OF THE DRAWINGS

The disclosure may be understood by reference to the following description taken in conjunction with the accompanying drawings, in which like reference numerals identify like elements, and in which.

Figure 1:
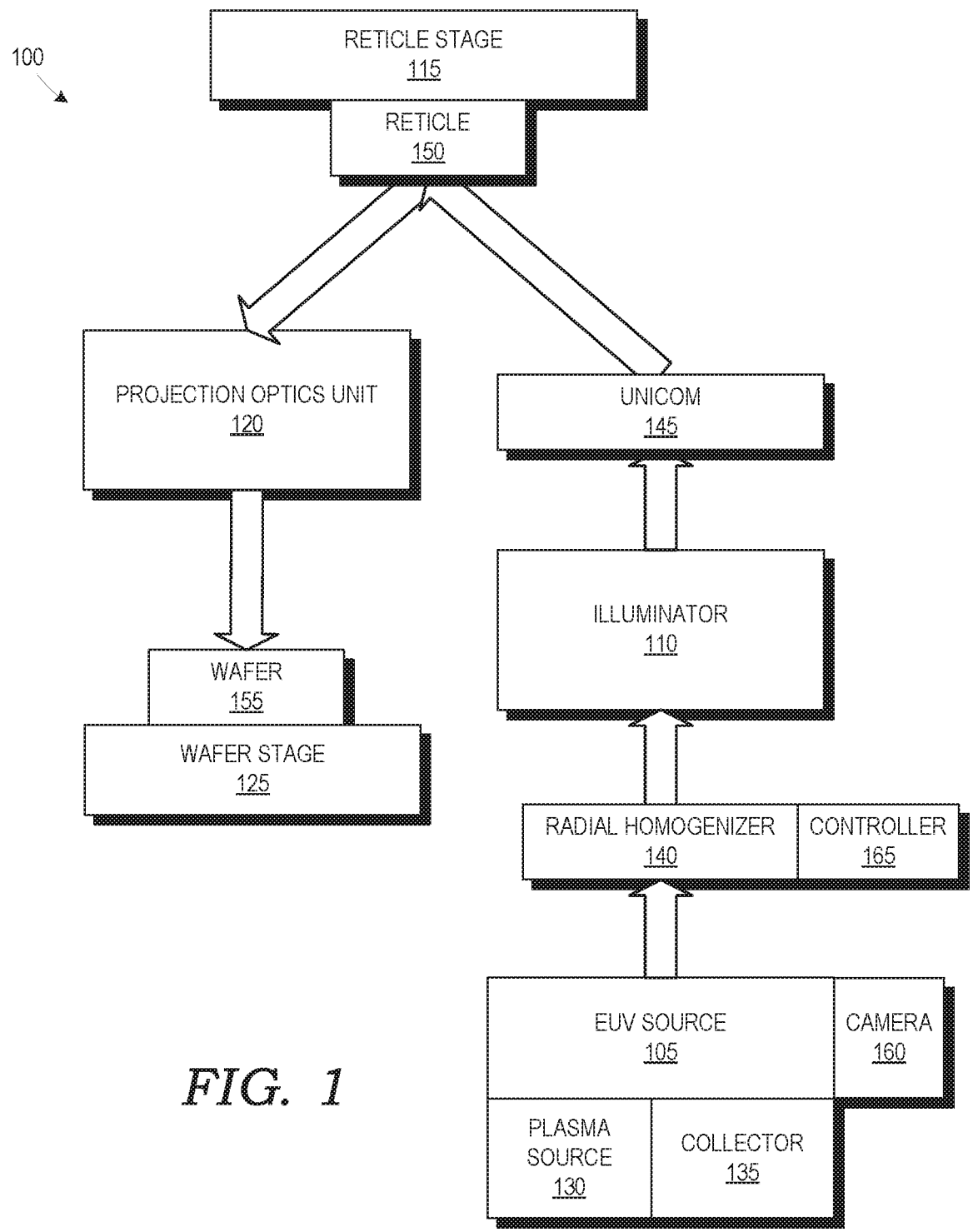
FIG. 1 is a simplified block diagram of a lithography scanner, in accordance with some embodiments disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to a radial lithographic source homogenizer. With reference to the attached figures, various illustrative embodiments of the methods and devices disclosed herein will now be described in more detail.

FIG. 1 is a simplified block diagram of a lithography scanner 100, in accordance with some embodiments disclosed herein. The primary functional blocks of the lithography scanner 100 include an extreme ultraviolet (EUV) source 105, an illuminator 110, a reticle stage 115, a projection optics unit 120, and a wafer stage 125. The EUV source 105 includes a plasma source 130 (e.g., Sn plasma source) and a collector 135. The plasma source 130 generates EUV light using a plasma formed from tin (Sn) droplets and a high power $CO_2$ laser, and the collector 135 focuses the collected EUV light for transmission to the illuminator 110. The light output from the EUV source 105 is provided to a radial homogenizer 140. As described in greater detail below, the radial homogenizer 140 attempts to account for degradation of the collector 135 arising from the collecting of tin droplets thereon.

Light from the EUV source 105 is conditioned by the illuminator 110 based on the desired illumination conditions (e.g., dipole, quadrapole, annular, etc.). A uniformity correction module (UNICOM) 145 employs a slit for projecting the light from the illuminator 110 to a reticle 150 mounted to the reticle stage 115 to attempt to provide uniform light intensity across the entire reticle field. The reticle 150 includes the lithographic pattern to be imaged multiple times onto a wafer 155 held on the wafer stage 125 using a scanning technique. The reticle stage 115 continually scans the illumination beam from the illuminator 110 across the field of the reticle 150. The projection optics unit 120 focuses the light from the reticle 150 onto the wafer 155.

In general, the uniformity of the light from the collector 135 is affected by tin contamination. The illuminator 110 attempts to randomize the light rays from the collector 135 using programmable field and pupil facet mirrors (not separately shown). Non-uniformity of the light from the collector 135 is thus randomly distributed across the field. However, as the degree of contamination increases, this randomization loses effectiveness, and dead pixels are evident in the field. Pupil uniformity correction at the UNICOM 145 cannot correct for single pixel fails, since the pupil light has already been homogenized. The radial homogenizer 140 allows source balancing to reduce asymmetry. Correction by the radial homogenizer 140 may be conducted gradually over the course of the degradation of the collector 135 as tin droplets build up.

Figure 2:
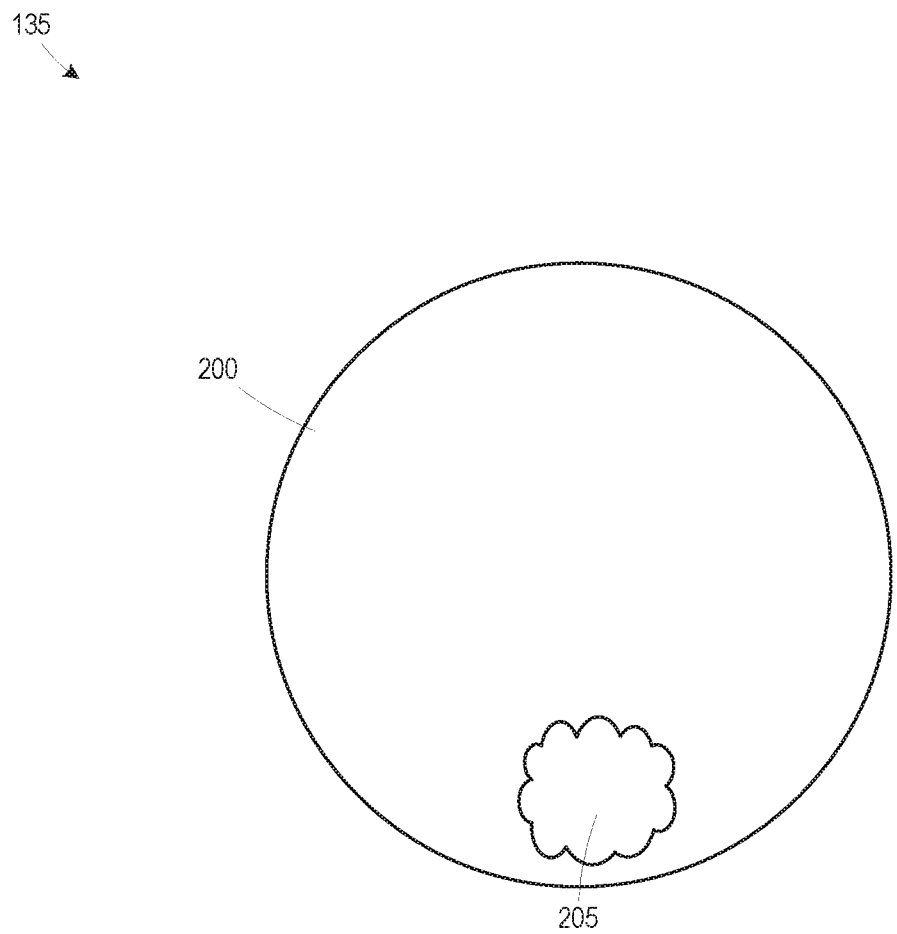
FIG. 2 is a diagram of a far-field EUV beam profile from the collector of the scanner of FIG. 1, in accordance with some embodiments disclosed herein.

FIG. 2 is a simplified diagram of a far-field EUV beam profile 200 from the collector 135. In general, the collector 135 is an ellipsoidal mirror with a center aperture that allows laser light to be directed onto tin droplets to generate a plasma for the EUV light source. The far-field EUV beam profile 200 represents a two-dimensional projection of the collector 135. Over time, tin contaminates the collector 135 due to molten tin droplets, tin flakes, or tin films (e.g., by chemical vapor deposition (CVD)) that deposit thereon resulting in one or more contamination regions. An example contamination region causes a dead region 205 in the far-field EUV beam profile 200. For ease of illustration, only a single dead region 205 is illustrated. In general, contamination that is relatively evenly distributed can be compensated for by the UNICOM 145. However, an asymmetric contamination region generates a single pixel dead region 205 for which the UNICOM 145 is unable to correct. The far-field EUV beam profile 200 represents a contamination map of the collector 135.

Figure 3A:
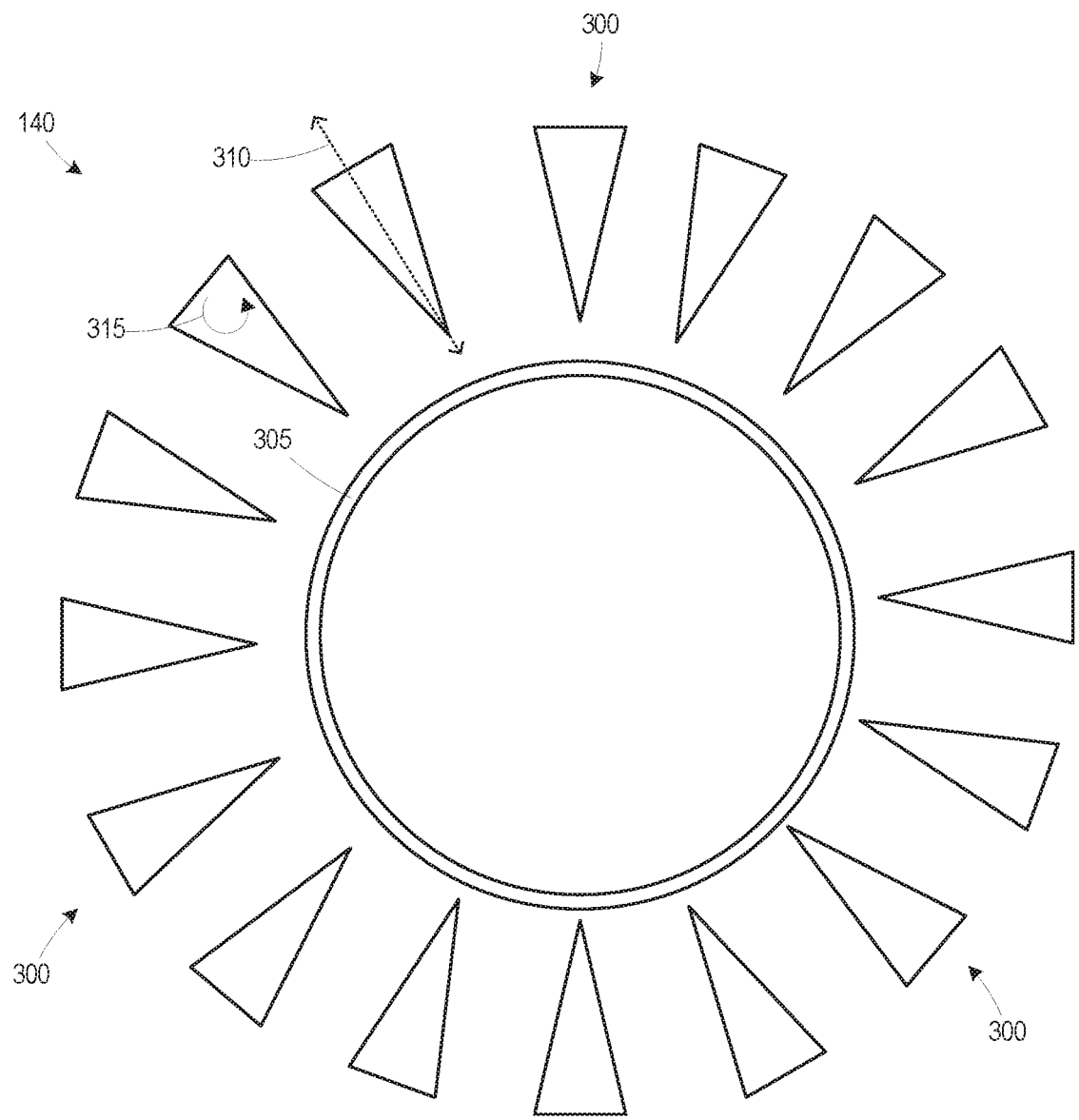
FIGS. 3A-3B are simplified diagrams of a radial homogenizer including movable light-blocking elements, in accordance with some embodiments disclosed herein.

FIG. 3A is a simplified diagram of the radial homogenizer 140. The radial homogenizer 140 includes a plurality of light-blocking elements 300 arranged radially around the circumference of an aperture 305 of the EUV source 105 through which light from the collector 135 is transmitted to the illuminator 110. In the illustrated embodiment, the light-blocking elements 300 have a generally triangular shape that allow them to be inserted into various positions in the field. However, other shapes may be employed. For ease of illustration, the positioning mechanics for the light-blocking elements 300 are not illustrated. In some embodiments, the light-blocking elements 300 may simply move along a radial axis 310 as may be implemented by a radial actuator. In other embodiments, the light-blocking elements 300 may move along the radial axis 310 and may also be rotated about an axis 315 proximate one end thereof.

Figure 3B:
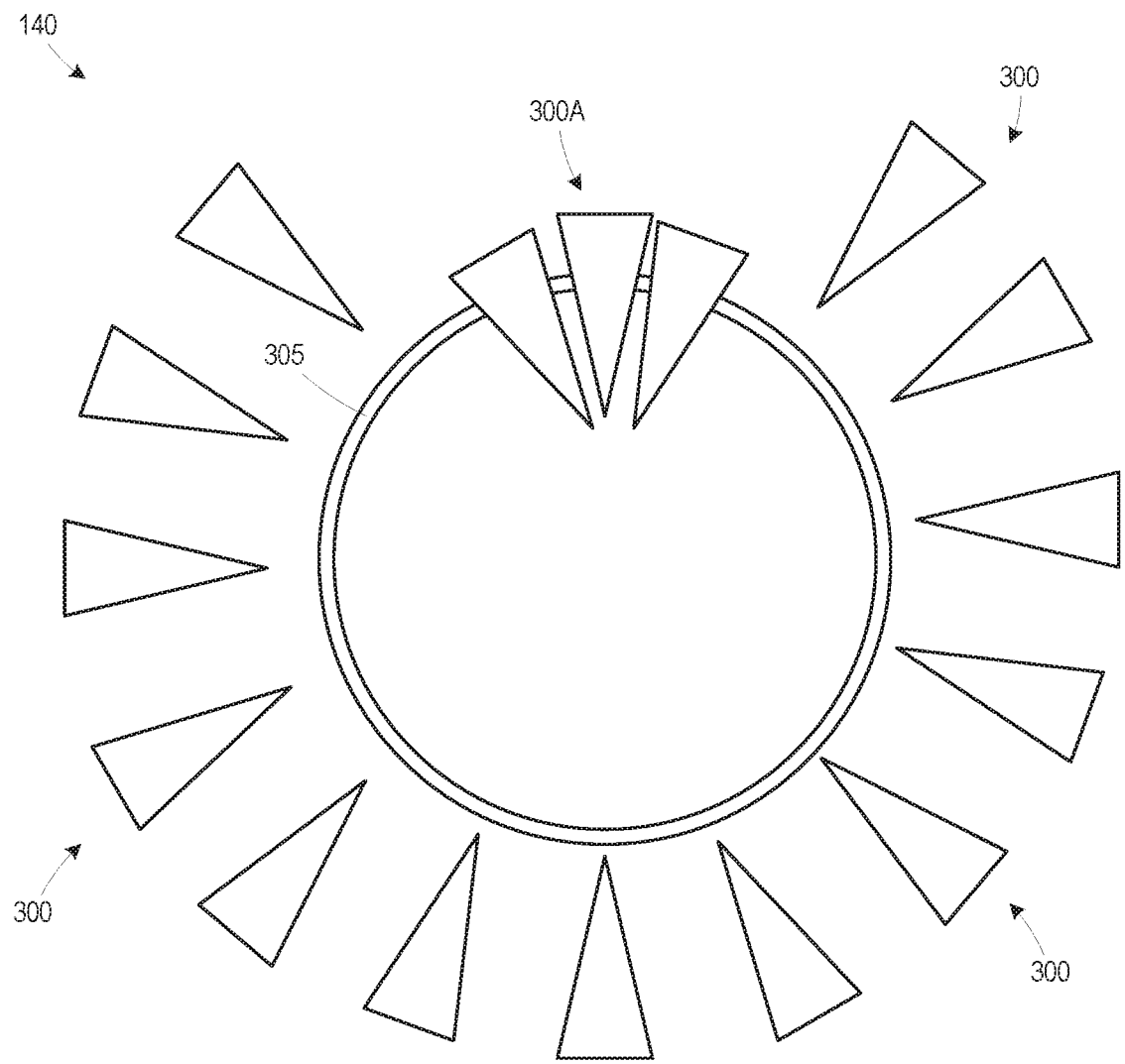

In some embodiments, the EUV source 105 may include a camera 160 for generating an image of the collector 135 from which a contamination map may be derived. The radial homogenizer 140 includes a controller 165. Based on the contamination map generated by the camera 160, the controller 165 configures the radial homogenizer 140 as shown in FIG. 3B to position a subset of the light-blocking elements 300A in the aperture 305 to compensate for asymmetric contamination regions, such as a contamination region causing the dead region 205 in FIG. 2. In some embodiments, a contamination map specifying the contamination region may be provided to the controller 165 by an operator of the EUV scanner 100.

Figure 4:
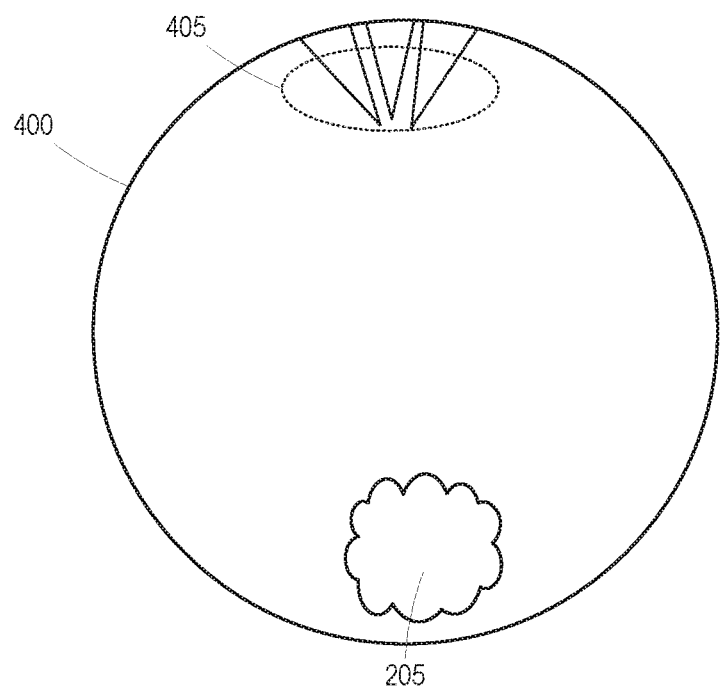
FIG. 4 is a diagram of a far-field EUV beam profile balanced by the radial homogenizer of FIGS. 3A-3B, in accordance with some embodiments disclosed herein.

FIG. 4 is a diagram of a far-field EUV beam profile 400 balanced by the radial homogenizer 140 configured as in FIG. 3B. The light-blocking elements 300 in the subset 300A cause a corresponding dead region 405 in the EUV beam profile 400 that balances the dead region 205 caused by tin contamination of the collector 135. In general, the dead region 405 exhibits radial (e.g., symmetry about the central axis of the collector 135) with respect to the original contamination region 205. The dead zone 405 mimics contamination on the collector 135 that is radially symmetric to the original contamination region 205 such that the EUV beam profile 400 is balanced (i.e., not asymmetric). Hence, there is no longer a single pixel dead region, and the UNICOM 145 is able to compensate for the variations in the beam profile 400.

The radial homogenizer 140 may be configured over time to adjust the positioning of the light-blocking elements 300 as contamination builds up on the collector 135. For example, the contamination analysis and correction using the light-blocking elements 300 may be conducted monthly. In some embodiments, the contamination analysis and correction using the light-blocking elements 300 may be conducted after a tool event occurs that is expected to generate contamination, such as an extended processing run of substrates. After changing the positions of the light-blocking elements 300, the randomizing field/pupil mirrors in the illuminator 110 and the UNICOM 145 may require re-calibration. Periodically compensating for the contamination build-up on the collector 135 extends the operating life (e.g., time between maintenance procedures to change the collector 135) of the EUV source 105, thereby increasing throughput.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   identifying a contamination region of a collector in a light source;
   positioning a subset of a plurality of movable light-blocking elements around a periphery of a circular aperture of the light source to compensate for the contamination region; and
   transmitting light from the light source through the circular aperture.

2. The method of claim 1, wherein the light source comprises a laser-driven plasma source, and the contamination region includes a metal deposited on the collector by the laser-driven plasma source.

3. The method of claim 2, wherein the metal comprises tin.

4. The method of claim 1, wherein each of the plurality of movable light-blocking elements has a triangular shape.

5. The method of claim 1, wherein positioning the subset of the plurality of movable light-blocking elements comprises moving a selected movable light-blocking element in the subset along a radial axis.

6. The method of claim 1, wherein positioning the subset of the plurality of movable light-blocking elements comprises rotating a selected movable light-blocking element in the subset about an axis proximate an end thereof.

7. The method of claim 1, wherein transmitting light from the light source comprises transmitting light having a wavelength shorter than 124 nm.

8. The method of claim 1, further comprising:
   capturing an image of the collector;
   generating a contamination map of the collector based on the image; and
   identifying the contamination region based on the contamination map.

9. The method of claim 1, wherein positioning the subset of a plurality of movable light-blocking elements comprises positioning the subset of a plurality of movable light-blocking elements to create a dead zone in a region of the circular aperture, wherein the dead zone has radial symmetry with respect to the contamination region.

10. A method, comprising:
    generating a tin plasma in a light source having a circular aperture;
    identifying a contamination region of tin on a collector in the light source, wherein the collector is to direct light from the light source to the circular aperture;
    positioning a subset of a plurality of movable light-blocking elements around a periphery of the circular aperture to compensate for the contamination region; and
    transmitting light from the light source through the circular aperture.

11. The method of claim 10, wherein each of the plurality of movable light-blocking elements has a triangular shape.

12. The method of claim 10, wherein positioning the subset of the plurality of movable light-blocking elements comprises moving a selected movable light-blocking element in the subset along a radial axis.

13. The method of claim 10, wherein positioning the subset of the plurality of movable light-blocking elements comprises rotating a selected movable light-blocking element in the subset about an axis proximate an end thereof.

14. The method of claim 10, wherein positioning the subset of a plurality of movable light-blocking elements comprises positioning the subset of a plurality of movable light-blocking elements to create a dead zone in a region of the circular aperture, wherein the dead zone has radial symmetry with respect to the contamination region.

15. An apparatus, comprising:
    a plasma source to generate light;
    a collector to direct the light to a circular aperture;
    a radial homogenizer comprising a plurality of movable light-blocking elements proximate the circular aperture; and
    a controller to identify a contamination region of the collector and position a subset of the plurality of movable light-blocking elements around the circular aperture to compensate for the contamination region.

16. The apparatus of claim 15, wherein the light source comprises a laser-driven plasma source, and the contamination region includes a metal deposited on the collector by the laser-driven plasma source.

17. The apparatus of claim 15, wherein each of the plurality of movable light-blocking elements has a triangular shape.

18. The apparatus of claim 15, wherein the controller is to move a selected movable light-blocking element along a radial axis.

19. The apparatus of claim 15, wherein the controller is to rotate a selected movable light-blocking element about an axis proximate an end thereof.

20. The apparatus of claim 15, further comprising a camera to capture an image of the collector, wherein the controller is to generate a contamination map of the collector based on the image and identify the contamination region based on the contamination map.

* * * * *